(12) United States Patent
Hur et al.

(10) Patent No.: US 8,421,062 B2
(45) Date of Patent: Apr. 16, 2013

(54) NANOFIBER COMPOSITE, METHOD OF MANUFACTURING THE SAME, AND FIELD EFFECT TRANSISTOR INCLUDING THE SAME

(75) Inventors: Jae-hyun Hur, Seongnam-si (KR); Jong-jin Park, Hwaseong-si (KR); Seung-nam Cha, Seoul (KR); Jong-min Kim, Yongin-si (KR); Chi-yul Yoon, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 112 days.

(21) Appl. No.: 12/801,892

(22) Filed: Jun. 30, 2010

(65) Prior Publication Data

US 2011/0168980 A1 Jul. 14, 2011

(30) Foreign Application Priority Data

Jan. 13, 2010 (KR) .................. 10-2010-0003133

(51) Int. Cl.
- *H01L 29/08* (2006.01)
- *H01L 21/00* (2006.01)
- *H01B 1/00* (2006.01)
- *D02G 3/00* (2006.01)

(52) U.S. Cl.
USPC ............. 257/40; 438/99; 252/500; 428/364; 977/762

(58) Field of Classification Search ........... 257/40, 257/E51.03, E51.031, E51.036; 977/762; 252/500; 428/364; 438/99

See application file for complete search history.

(56) References Cited

U.S. PATENT DOCUMENTS

| | | | |
|---|---|---|---|
| 6,228,904 B1 * | 5/2001 | Yadav et al. ............... | 523/210 |
| 2006/0019819 A1 | 1/2006 | Shao-Horn et al. | |
| 2006/0134716 A1 | 6/2006 | Gouma | |
| 2006/0213829 A1 | 9/2006 | Rutledge et al. | |
| 2006/0263417 A1 | 11/2006 | Lelkes et al. | |
| 2007/0089845 A1 | 4/2007 | Sotzing et al. | |
| 2007/0218281 A1 | 9/2007 | Demir et al. | |
| 2008/0217807 A1 | 9/2008 | Lee et al. | |
| 2008/0241297 A1 | 10/2008 | Park | |
| 2009/0130301 A1 | 5/2009 | Bahnmuller et al. | |
| 2009/0214956 A1 * | 8/2009 | Prieto et al. ............... | 429/310 |

OTHER PUBLICATIONS

Hua Bai et al., "Composite nanofibers of conducting polymers and hydrophobic insulating polymers: Preparation and sensing applications" Polymer 50, 2009, pp. 3292-3301.

Ming Wei et al., "Preparation of Core-Sheath Nanofibers from Conducting Polymer Blends" Macromolecular Rapid Communications, vol. 26, 2005, pp. 1127-1132.

Ming Wei et al., "Core-Sheath Structure in Electrospun Nanofibers from Polymer Blends" Macromolecular Materials and Engineering, vol. 291, Issue 11, Nov. 16, 2006, Abstract.

(Continued)

*Primary Examiner* — William D Coleman
(74) *Attorney, Agent, or Firm* — Harness, Dickey & Pierce, P.L.C.

(57) ABSTRACT

A nanofiber composite including a nanofiber formed of a hydrophobic polymer, a nanowire formed of a conductive or semiconductive organic material that is oriented in the nanofiber in the longitudinal direction of the nanofiber, and an ionic active material.

20 Claims, 8 Drawing Sheets

OTHER PUBLICATIONS

Zaicheng Sun et al., "Compound Core-Shell Polymer Nanofibers by Co-Electrospinning" Advanced Materials, vol. 15, No. 22, Nov. 17, 2003, pp. 1929-1932.

Yasmin Srivastava et al., "Electrospinning of hollow and core/sheath nanofibers using a microfluidic manifold" Micofluid Nanofluid, 2007, whole document.

Shalom Goffri et al., "Multicomponent semiconducting polymer systems with low crystallization-induced percolation threshold," published online: Nov. 26, 2006; doi; 1038/nmatl779, Nature Materials, vol. 5, Dec. 2006 www.nature.com/naturematerials, pp. 950-956.

Longzhen Qiu et al., "Organic Thin-film Transistors based on Ploythiophene Nanaowires Embedded in Insulating Polymer," DOI: 10.1002/adma.200802880, Advance Materials, www.advmat.de, Wiley InterScience, pp. 1349-1353.

* cited by examiner

NANOFIBER COMPOSITE, METHOD OF MANUFACTURING THE SAME, AND FIELD EFFECT TRANSISTOR INCLUDING THE SAME

CROSS-REFERENCE TO RELATED APPLICATIONS

This application claims priority under 35 U.S.C. §119 to Korean Patent Application No. 10-2010-0003133, filed on Jan. 13, 2010, in the Korean Intellectual Property Office, the contents of which is incorporated herein in its entirety by reference.

BACKGROUND

1. Field

Example embodiments relate to a nanofiber composite, and more particularly, to a nanofiber composite including a conductive or semiconductive organic material, a method of manufacturing the nanofiber composite, and a field effect transistor including the same.

2. Description of the Related Art

Nanowires have a large specific surface area per unit volume. Accordingly, they may contribute to improving the performances of devices and also reducing the size thereof, and thus much research is being conducted into replacing two-dimensional thin films in general devices with nanowires.

Organic material-based nanowires may be simpler and less inexpensively manufactured when compared to inorganic material-based nanowires and may be applied to a flexible substrate. Electrospinning is an efficient way to manufacture nanofibers including organic nanowires having a diameter ranging from several ten to several hundred nanometers.

Conventionally, electrospinning of a conductive or semiconductor polymer has been conducted by dissolving the conductive or semiconductor polymer in a solvent. A nanofiber formed by electrospinning of conductive or semiconductor polymer has suitable electrical properties. However, since conductive or semiconductor polymers are sensitive to moisture and oxygen in air, physical properties of a nanofiber formed of conductive or semiconductor polymers may be changed by the ambient humidity or oxygen, or electrical properties of the nanofiber may deteriorate with time.

SUMMARY

Provided are a nanofiber composite including a conductive or semiconductive organic material and having improved processability without loss of physical and electrical properties due to ambient factors, a method of manufacturing the nanofiber composite, and a field effect transistor including the nanofiber composite.

Additional aspects will be set forth in part in the description which follows and, in part, will be apparent from the description, or may be learned by practice of the presented embodiments.

According to example embodiments, a nanofiber composite includes: a nanofiber formed of a hydrophobic polymer; at least one nanowire formed of a conductive or semiconductive organic material that is oriented in the nanofiber in a longitudinal direction of the nanofiber; and an ionic active material in the at least one nanowire and in the nanofiber According to example embodiments, a method of manufacturing a nanofiber composite includes: preparing a composition by dissolving a conductive or semiconductive organic material, a hydrophobic polymer, and an ionic active material in a solvent; and forming a nanofiber composite from the composition, wherein the nanofiber composite includes a nanofiber formed of the hydrophobic polymer and at least one nanowire formed of the conductive or semiconductive organic material that is oriented in the nanofiber in a longitudinal direction of the nanofiber.

According to example embodiments, a field effect transistor includes: a gate electrode; source and drain electrodes electrically insulated from the gate electrode and separated from each other; and a channel formed of a nanofiber composite connecting the source and drain electrodes.

BRIEF DESCRIPTION OF THE DRAWINGS

Illustrative, non-limiting example embodiments will be more clearly understood from the following description of example embodiments, taken in conjunction with the accompanying drawings of which.

DETAILED DESCRIPTION

Figure 1A:
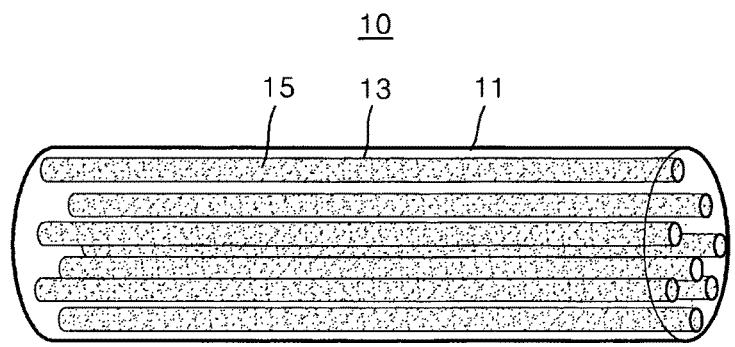
FIG. 1A is a perspective view of a nanofiber composite including a conductive or semiconductive organic material and a hydrophobic polymer according to example embodiments.

Hereinafter, a nanofiber composite, a method of manufacturing the same, and a field effect transistor including the same according to example embodiments will be described in detail by explanation with reference to the attached drawings. Like reference numerals refer to the like elements throughout. In the drawings, the thicknesses of layers and regions are exaggerated for clarity. Example embodiments may, however, be embodied in many different forms and should not be construed as being limited to example embodiments set forth herein; rather, these example embodiments are provided so that this disclosure will be thorough and complete, and will fully convey the concept of example embodiments to those of ordinary skill in the art.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
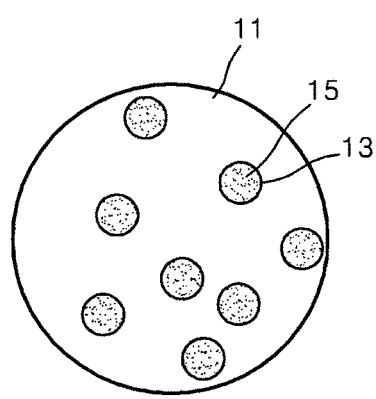
FIG. 1B is a cross-sectional view of the nanofiber composite of FIG. 1A.

FIG. 1A is a perspective view of a nanofiber composite 10 including a conductive or semiconductive organic material and a hydrophobic polymer according to example embodiments, and FIG. 1B is a cross-sectional view of the nanofiber composite 10 of FIG. 1A. Referring to FIGS. 1A and 1B, the conductive or semiconductive organic material is oriented in a nanofiber 11 formed of a hydrophobic polymer in a longitudinal direction of the nanofiber 11 to form a nanowire 13. A plurality of nanowires 13 are formed of the conductive or semiconductive organic material in the nanofiber 11 formed of the hydrophobic polymer. The nanofiber 11 formed of the hydrophobic polymer and the nanowire 13 formed of the conductive or semiconductive organic material may further include an ionic active material 15.

Figure 2A:
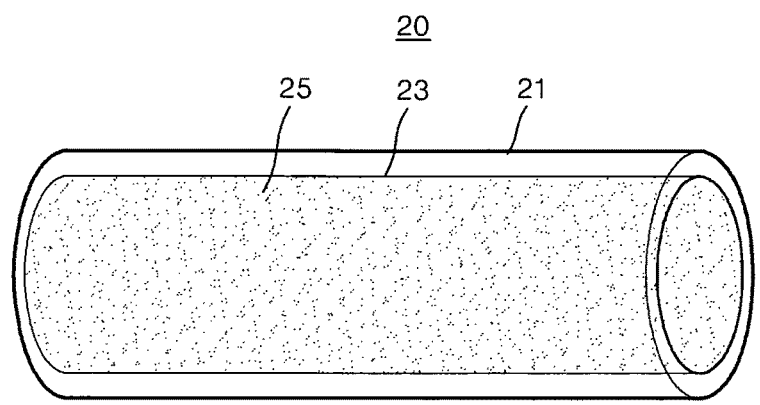
FIG. 2A is a perspective view of a nanofiber composite including a conductive or semiconductive organic material and a hydrophobic polymer according to example embodiments.
Figure 2B:
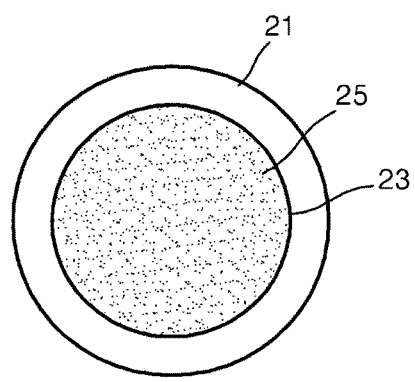
FIG. 2B is a cross-sectional view of the nanofiber composite of FIG. 2A.

FIG. 2A is a perspective view of a nanofiber composite 20 including a conductive or semiconductive organic material and a hydrophobic polymer according to another example embodiments, and FIG. 2B is a cross-sectional view of the nanofiber composite of FIG. 2A. Referring to FIGS. 2A and 2B, a single nanowire 23 is formed of the conductive or semiconductive organic material at the center of a nanofiber 21 formed of the hydrophobic polymer, so that the nanofiber composite 20 has a core-shell structure. The single nanowire 23 includes an ionic active material 25.

Since the nanowires 13 and 23 formed of the conductive or semiconductive organic materials are oriented in the longitudinal direction of the nanofibers 11 and 21, a mobility of a charge carrier is improved. In addition, since the conductive or semiconductive organic materials 13 and 23 are surrounded by the nanofibers 11 and 21, external moisture or oxygen are blocked, and thus, the electrical performance of the conductive or semiconductive organic materials 13 and 23 may be stably maintained. In addition, the nanowires 13 and 23 may have improved electrical conductivity due to the ionic active materials 15 and 25.

Hereinafter, elements forming the nanofiber composites described with reference to FIGS. 1A, 1B, 2A, and 2B will be described in detail.

The conductive or semiconductive organic materials 13 and 23 may be a high molecular weight material, intermediate molecular weight material, or low molecular weight material. The conductive or semiconductor high molecular weight material may include poly-3-hexylthiophene, polyaniline, polypyrrole, poly paraphenylene vinylene, polyacetylene, poly[9,9(dioctylfluorenyl-2,7-diyl)-co-(9-hexyl-3,6-carbazole)], poly[9,9(dioctyl fluorenyl-2,7-diyl)-co-(1,4-diphenylenevinylene-2-methoxy-5-{2-ethylhexyloxy}-benzene)], and poly[{2-methoxy-5-(2-ethylhexyl oxy}-1,4-(1-cyanovinylenephenylene))-co-{2,5-bis(N,N'-diphenylamino)-1,4-phenylene}].

The conductive or semiconductor intermediate molecular weight material or low molecular weight material may include pentacene, tetracene, antracene, rubrene, parylene, coronen, α-sexithiophene, copper phthalocyanine, merocyanine, perylenetetracarboxyldiimide derivatives, carbon nanotube (CNT), and graphene.

The hydrophobic polymers 11 and 21 may protect the conductive or semiconductive organic materials 13 and 23 from external environment such as moisture and may have insulating property.

The hydrophobic polymers 11 and 21 may include polystyrene, styrene copolymers, polyethylene, ethylene copolymers, polybutadiene, butadiene copolymers, polyvinylidene fluoride, and fluoropolymers (Teflon@AF, Teflon@NXT, Teflon@PFA, Teflon@PTFE, Tefzel@ETFE, Zonyl@PTFE). The styrene copolymer may include poly (styrene-co-butadiene)) and poly(stryrene-co-ethylene).

The ionic active material may improve electrical properties such as conductivity and/or semiconducting property of the nanofiber composites 10 and 20. The ionic active material may be an ionic liquid or ionomer. The ionomer may be an anionic ionomer, cationic ionomer, or bipolar ionomer.

A cation of the ionic liquid may include substituted or unsubstituted imidazolium, pyrazolium, triazolium, thiazolium, oxazolium, pyridazinium, pyrimidinium, pyrazinium, ammonium, phosphonium, guanidinium, euronium, thioeuronium, pyridinium, and pyrrolium.

Examples of the cation of the ionic liquid may include 1,3-dimethylimidazolium, 1-butyl-3-methylimidazolium, 1-ethyl-3-methylimidazolium, 1-hexadecyl-3-methylimidazolium, 1-hexyl-3-methylimidazolium, 3-methyl-1-octadecylimidazolium, 3-methyl-1-octylimidazolium, 3-methyltetradecylimidazolium, 1-butyl-2,3-dimethylimidazolium, 1-ethyl-2,3-dimethylimidazolium, 1-hexadecyl-2,3-dimethylimidazolium, 1-hexyl-2,3-dimethylimidazolium, 1,2,3-trimethylimidazolium; N-hexylpyridinium, N-butyl-3,4-dimethylpyridinium, N-butyl-3,5-dimethylpyridinium, N-butyl-3-methylpyridinium, N-butyl-4-methylpyridinium, N-butylpyridinium, N-ethylpyridinium, N-hexylpyridinium, N-octylpyridinium; 1,1-dimethylpyrrolidium, 1-butyl-1-methylpyrrolidium, 1-hexyl-1-methylpyrrolidium, 1-methyl-1-octylpyrrolidium; trihexyl(tetradecyl)phosphonium; methyltrioctylammonium, ethyl-dimethyl-propylammonium; guanidinium, N"-ethyl-N,N,N',N'-tetramethylguanidinium, O-ethyl-N,N,N',N'-tetramethylisoeuronium, and S-ethyl-N,N,N',N'-tetramethylisothioeuronium.

Anions of the ionic liquid may include substituted or unsubstituted sulfonate-based anion, cyanate-based anion, thiocyanate-based anion, and carboxylate-based anion.

The ionomer may include an ethylene acrylic acid copolymer, a polyurethane ionomer having a polytrimethylene oxide bond, and an α-olefin copolymer ionomer having ethylene, propylene, 1-butene, 1-pentene, 1-hexene, 1-heptene, 3-methyl-1-butene, or 4-methyl-1-pentene as α-olefin.

Figure 3:
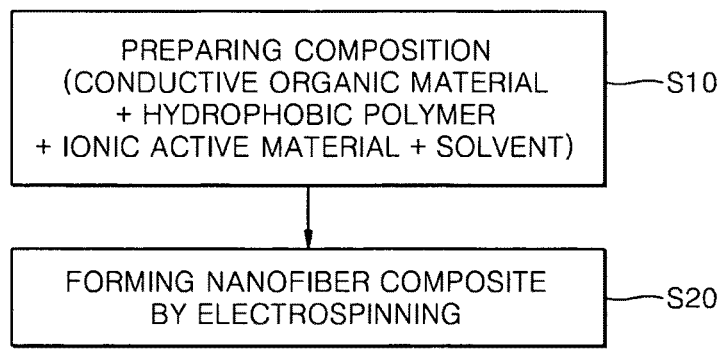
FIG. 3 is a flowchart illustrating a method of manufacturing a nanofiber composite.

FIG. 3 is a flowchart illustrating a method of manufacturing a nanofiber composite.

Referring to FIG. 3, a conductive or semiconductive organic material, a hydrophobic polymer, and an ionic active material are completely dissolved in a solvent to prepare a composition for spinning in operation S10. In this regard, the composition for spinning is maintained at a temperature in the range of about 40 to about 70° C.

The conductive or semiconductive organic material may be a high molecular weight material, intermediate molecular weight material, or a low molecular weight material. The conductive or semiconductive high molecular weight material may include at least one selected from the group consisting of poly-3-hexylthiophene, polyaniline, polypyrrole, poly paraphenylene vinylene, polyacetylene, poly[9,9(dioctylfluorenyl-2,7-diyl)-co-(9-hexyl-3,6-carbazole)], poly[9,9(dioctyl fluorenyl-2,7-diyl)-co-(1,4-diphenylenevinylene-2-methoxy-5-{2-ethylhexyloxy}-benzene)] and poly[{2-methoxy-5-(2-ethylhexyl oxy}-1,4-(1-cyanovinylenephenylene))-co-{2,5-bis(N,N'-diphenylamino)-1,4-phenylene}].

The conductive or semiconductor intermediate molecular weight material or low molecular weight material may include pentacene, tetracene, antracene, rubrene, parylene, coronen, α-sexithiophene, copper phthalocyanine, merocyanine, perylenetetracarboxyldiimide derivatives, carbon nanotube (CNT), and graphene.

While the solvent is evaporated during electrospinning, the intermediate molecular weight material or low molecular weight material is self-aligned in a specific direction when transformed from a liquid state to a solid state to form a nanowire. In addition, since the nanofiber is formed while the composition is being stretched in a specific direction by a high electrical field during the electrospinning, the nanowire may be easily formed from the organic material in the hydrophobic polymer nanofiber. The nanowire formed of the organic material may provide an efficient pathway for a charge carrier.

The hydrophobic polymer may include polystyrene, styrene copolymers, polyethylene, ethylene copolymers, polybutadiene, butadiene copolymers, polyvinylidene fluoride, and fluoropolymers (Teflon@AF, Teflon@NXT, Teflon@PFA, Teflon@PTFE, Tefzel@ETFE, Zonyl@PTFE). The styrene copolymer may include poly(styrene-co-butadiene)) and poly(stryrene-co-ethylene).

The solvent dissolving the high molecular weight material may include chloroform, chlorobenzene, tetrahydrofuran, toluene, acetone, ethanol, methanol, dimethylformamide, dimethylsulfoxide, benzene, dioxane, cyclohexane, acetic acid, and water. The solvent may be a mixture of at least two of the foregoing. For example, a mixture solvent including chloroform and chlorobenzene may be used.

The ionic active material may be an ionic liquid or ionomer. The ionomer may be an anionic ionomer, cationic ionomer or bipolar ionomer.

A cation of the ionic liquid may include substituted or unsubstituted imidazolium, pyrazolium, triazolium, thiazolium, oxazolium, pyridazinium, pyrimidinium, pyrazinium, ammonium, phosphonium, guanidinium, euronium, thioeuronium, pyridinium, and pyrrolium.

An anion of the ionic liquid may include substituted or unsubstituted sulfonate-based anion, cyanate-based anion, thiocyanate-based anion, and carboxylate-based anion.

The ionomer may include an ethylene acrylic acid copolymer, a polyurethane ionomer having a polytrimethylene oxide bond, and an α-olefin copolymer ionomer having ethylene, propylene, 1-butene, 1-pentene, 1-hexene, 1-heptene, 3-methyl-1-butene, or 4-methyl-1-pentene as α-olefin.

Figure 4:
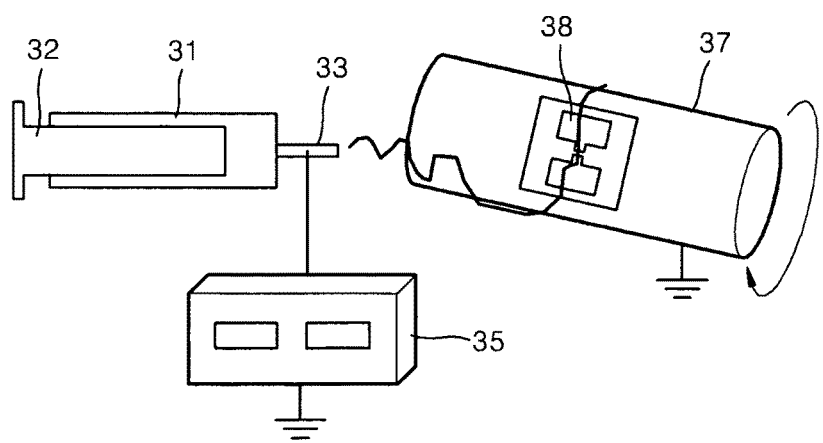
FIG. 4 schematically shows an electrospinning device.

A nanofiber composite is prepared using the composition for spinning by electrospinning in operation S20. FIG. 4 schematically shows an electrospinning device. The composition for spinning filled in an injector 31 is pressed and discharged out of a nozzle 33 at a constant rate using an injector pump 32. In this regard, the composition for spinning is maintained at a temperature in the range of about 40 to about 70° C. When a droplet of the composition is formed out of the nozzle 33, the composition is electrospun to a collector 37 by applying a voltage in the range of about 10 to about 20 KV to the nozzle 33 using a power supply unit 35 to form a nanofiber composite. Optionally, the collector 37 is rotated at a higher speed, or a voltage is applied between two electrodes 28 connected to the collector 37, so that the nanofiber composite is formed in a single direction.

In the nanofiber composite prepared as described above, the conductive or semiconductive organic material is oriented in a nanofiber formed of a hydrophobic polymer in a longitudinal direction of the nanofiber to form a plurality of nanowires, and the ionic active material is dispersed in the nanowire and nanofiber as described with reference to FIGS. 1A and 1B.

Alternatively, a nanofiber composite having a core-shell structure may be prepared by electrospinning using a double nozzle in the electrospinning device. In other words, the nanofiber composite having a core including the conductive or semiconductive organic material in which the ionic active material is dispersed and a shell including the hydrophobic polymer may be prepared by spinning a composition including the conductive or semiconductive organic material and the ionic active material via an inner nozzle and the hydrophobic polymer via an outer nozzle.

Meanwhile, the nanofiber composite may also be prepared using the composition for spinning by wet spinning, conjugate spinning, melt blown spinning, or flash spinning.

Figure 5:
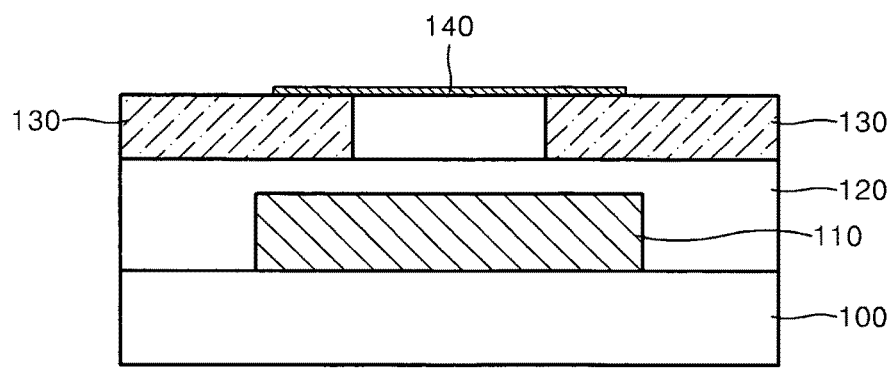
FIG. 5 is a cross-sectional view of a field effect transistor including a nanofiber composite as a channel.

FIG. 5 is a cross-sectional view of a field effect transistor including a nanofiber composite as a channel. Referring to FIG. 5, an insulating layer 120 is formed on a gate electrode 110 of a substrate 100. Source/drain electrodes 130 are formed of conductive materials on the insulating layer 120. The source/drain electrodes 130 are spaced apart from each other. A nanofiber composite 140 is formed to connect the source/drain electrodes 130.

The nanofiber composite 140 may be the nanofiber composite described with reference to FIGS. 1A, 1B, 2A, and 2B above. In other words, the nanofiber composite including the nanowire that is formed by elongating the conductive or semiconductive organic material in the hydrophobic polymer and the ionic active material that is dispersed in the nanowire and the nanofiber, or in the nanowire, may be used as a channel of a transistor. As described above, the conductive or semiconductive organic material may be a high molecular weight material, intermediate molecular weight material, or a low molecular weight material.

A part of the nanofiber formed of the hydrophobic polymer of the nanofiber composite 140 may be selectively removed to electrically connect the source/drain electrodes 130 and the nanowire formed of the conductive or semiconductive organic material. If the nanofiber composite 140 includes a plurality of nanowires, a part of the nanowire formed of the conductive or semiconductive organic material may be exposed to outside of the nanofiber composite 140, and the nanofiber composite 140 may be electrically connected to the source/drain electrodes 130 via the exposed portion of the nanowire.

A transistor including a substantially one-dimensional channel formed of the nanofiber composite may have a higher mobility of a charge carrier and/or a low power consumption compared to a transistor including a substantially two-dimensional channel.

Typically, the conductive or semiconductive organic material is sensitive to moisture, and thus electrical performance of the conductive or semiconductive organic material can be significantly decreased with time when exposed to the external agents. According to example embodiments, however, electrical performance of the nanofiber composite may be stably maintained because the hydrophobic polymer protects the conductive or semiconductive organic material from external agents. Thus, the nanofiber composite may be used as a channel of a transistor without demanding an additional encapsulation process for protecting the conductive or semiconductive organic material.

In FIG. 5, the gate electrode 110 is disposed below the source/drain electrodes 130. However, the nanofiber composite may be applied to a channel of a transistor with various structures. For example, the gate electrode 110 may be disposed on the source/drain electrodes 130.

Hereinafter, the preparation of the nanofiber composite and morphology and electrical properties of the nanofiber composite will be described in detail.

EXPERIMENTAL EXAMPLE 1

10 mg of poly-3-hexylthiophene and 50 mg of polystyrene were mixed with a solvent including 0.3 ml of chlorobenzene and 0.2 ml of chloroform at 55☐ to prepare a composition for spinning. The composition was filled in an injector and discharged from a nozzle using an injector pump at a constant rate of 0.4 ml/h. In order not to precipitate poly-3-hexylthiophene contained in the composition, the temperature of the composition in the injector was maintained at 55° C. When a droplet of the composition was formed out of the nozzle of the injector, the composition was electrospun to a collector by applying a voltage of 15 KV thereto using a power supply unit to prepare a nanofiber composite having a diameter in the range of several ten to several hundred nanometers (nm). Meanwhile, source/drain electrodes of a transistor were disposed on the collector such that the nanofiber composite formed a channel between the source/drain electrodes of the transistor.

EXPERIMENTAL EXAMPLE 2

10 mg of poly-3-hexylthiophene and 50 mg of polystyrene were mixed with a solvent including 0.01 ml of chlorobenzene and 0.4 ml of chloroform at 55° C. to prepare a composition for spinning. The composition was electrospun to prepare a nanofiber composite in the same manner as in Example 1.

Amounts of the elements contained in the compositions according to Experimental Examples 1 and 2 are shown in Table 1 below.

TABLE 1

| | Polymer | | Solvent | |
| --- | --- | --- | --- | --- |
| | Poly-3-hexylthiophene (mg) | Polystyrene (mg) | Chloroform (ml) | Chlorobenzene (ml) |
| Experimental Example 1 | 10 | 50 | 0.2 | 0.3 |
| Experimental Example 2 | 10 | 50 | 0.4 | 0.1 |

Figure 6:
FIG. 6 is an optical microscopic image of a composition that is electrospun according to Experimental Example 2.

In Experimental Example 1, 0.3 ml of chlorobenzene and 0.2 ml of chloroform were used. As the ratio of chlorobenzene to chloroform increases, the degree of the nanofiber formation increases. According to Experimental Example 2, when 0.1 ml of chlorobenzene and 0.4 ml of chloroform were used, a long nanofiber having a uniform thickness was formed. FIG. 6 is an optical microscopic image of a nanofiber prepared according to Experimental Example 2.

EXPERIMENTAL EXAMPLE 3

10 mg of poly-3-hexylthiophene and 40 mg of polystyrene were mixed with a solvent including 0.4 ml of chlorobenzene and 0.1 ml of chloroform at 55° C. to prepare a composition for spinning. The composition was electrospun to prepare a nanofiber composite in the same manner as in Example 1.

EXPERIMENTAL EXAMPLE 4

5 mg of poly-3-hexylthiophene and 50 mg of polystyrene were mixed with a solvent including 0.4 ml of chlorobenzene and 0.1 ml of chloroform at 55° C. to prepare a composition for spinning. The composition was electrospun to prepare a nanofiber composite in the same manner as in Example 1.

Amounts of the elements contained in the compositions according to Experimental Examples 3 and 4 are shown in Table 2 below.

TABLE 2

| | Polymer | | Solvent | |
|---|---|---|---|---|
| | Poly-3-hexylthiophene (mg) | Polystyrene (mg) | Chloroform (ml) | Chlorobenzene (ml) |
| Experimental Example 3 | 10 | 40 | 0.4 | 0.1 |
| Experimental Example 4 | 5 | 50 | 0.4 | 0.1 |

Figure 7:
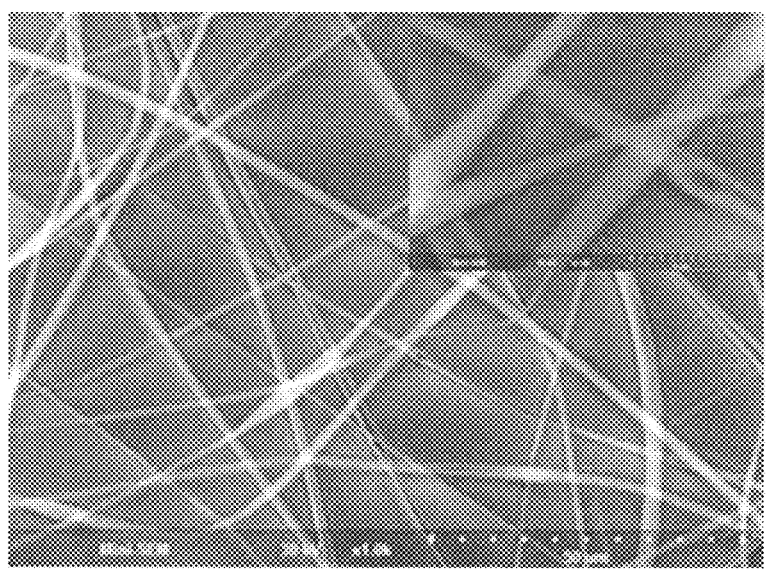
FIG. 7 is an optical microscopic image of a composition that is electrospun according to Experimental Example 4.

A nanofiber including small grains was produced when 10 mg of poly-3-hexylthiophene and 40 mg of polystyrene were used according to Experimental Example 3. A uniform nanofiber including less small grains than the nanofiber according to Experimental Example 3 was produced when 5 mg of poly-3-hexylthiophene and 50 mg of polystyrene were used according to Experimental Example 4. FIG. 7 is an optical microscopic image of the nanofiber prepared according to Experimental Example 4.

It was identified that the nanofiber had more uniform shape as the ratio of polystyrene to poly-3-hexylthiophene increases referring to Experimental Examples 3 and 4. However, when the ratio of polystyrene to poly-3-hexylthiophene was greater than a predetermined level, electrical properties of nanofiber deteriorated.

Figure 8:
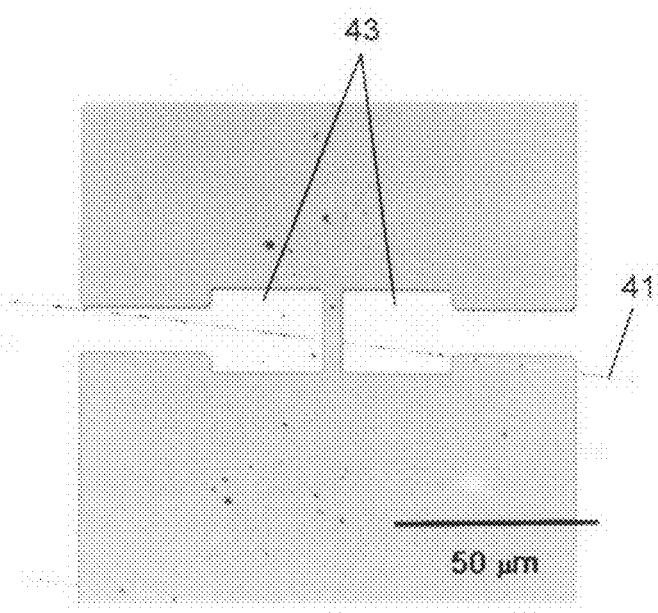
FIG. 8 is an optical microscopic image of nanofibers electrospun on electrodes of a field effect transistor.

FIG. 8 is a cross-sectional view of a field effect transistor including a nanofiber composite on electrodes as a channel. Referring to FIG. 8, the nanofiber 41 is disposed to cross both electrodes 43.

Figure 9:
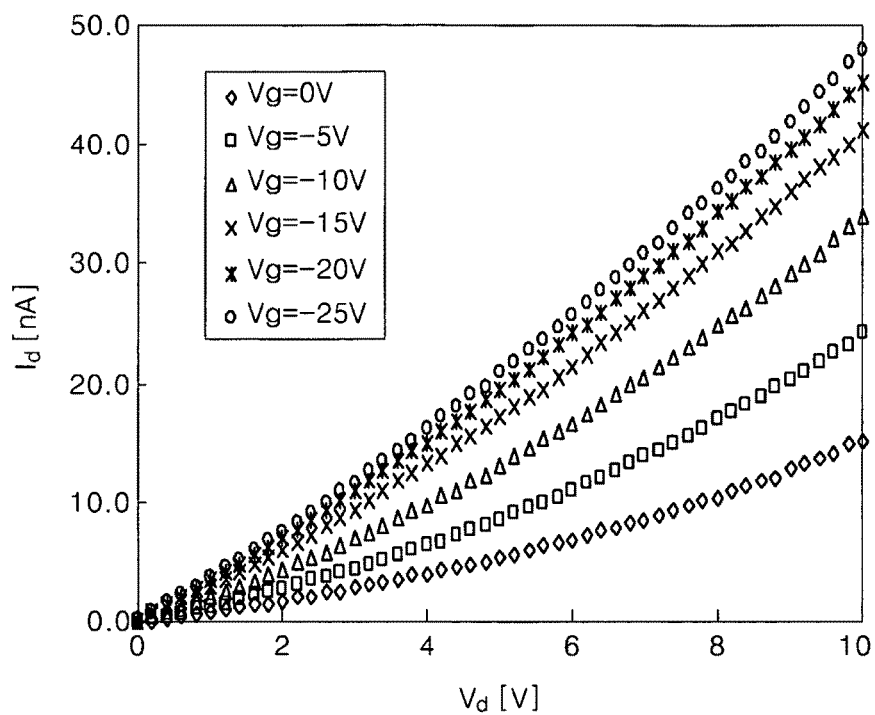
FIG. 9 is a graph illustrating drain voltages with respect to drain currents of a field effect transistor including a nanofiber composite channel that is formed by electrospinning a composition including poly-3-hexylthiophene and polystyrene at a weight ratio of 1:1.

FIG. 9 is a graph illustrating drain voltages with respect to drain currents of a field effect transistor including a nanofiber composite channel that is formed by electrospinning a composition including poly-3-hexylthiophene and polystyrene at a weight ratio of 1:1. Referring to FIG. 9, as the drain voltage increases, the drain current increases, and as the gate voltage increases, the slope of the graph of drain voltage with respect to drain current increases. Referring to the graph of FIG. 9 illustrating drain voltages with respect to drain currents, the transistor having a nanofiber composite channel shows general characteristics of a transistor.

Figure 10:
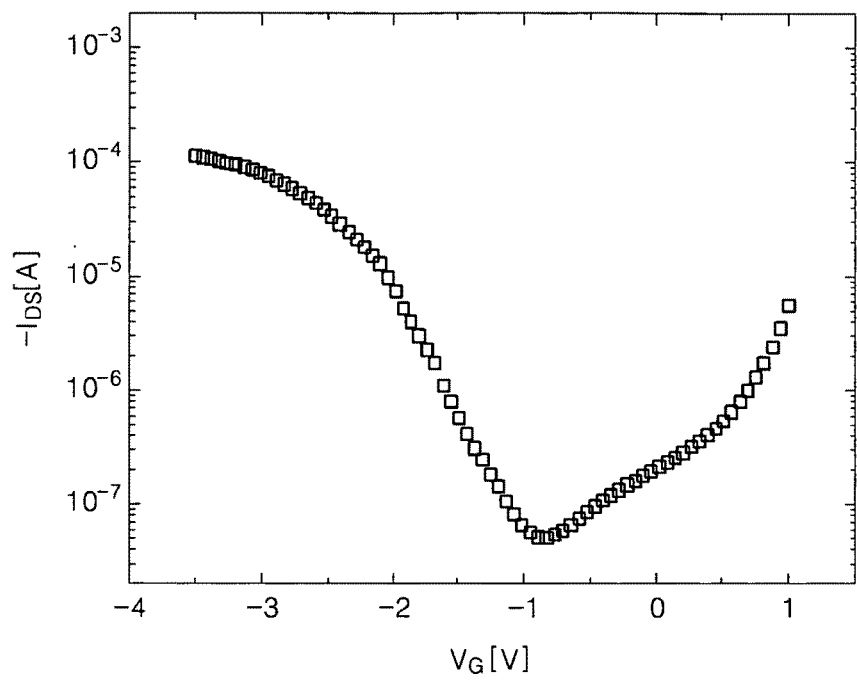
FIG. 10 is a graph illustrating gate voltages with respect to currents of a field effect transistor including a nanofiber composite channel having an ionic liquid.

FIG. 10 illustrates gate voltages with respect to channel current of a transistor including a nanofiber composite that is electrospun using a composition prepared by adding 5 mg of 1-butyl-3-methylimidazolium hexafluorophosphate (BMIM-PF6), as an ionic liquid, to a solution prepared by dissolving 10 mg of poly-3-hexylthiophene and 40 mg of polystyrene in a mixed solvent including chlorobenzene and chloroform.

Referring to FIG. 10, in the transistor having the nanofiber channel including the ionic liquid, a channel current is less than $10^{-7}$ A at a gate voltage of −1 V, and a channel current is greater than $10^{-5}$ A at a gate voltage of −3 V. Thus, it is identified that the difference between on-current and off-current increases. That is, if the nanofiber composite includes an ionic liquid, off-characteristics of a field effect transistor are significantly improved.

As described above, according to the one or more of the above example embodiments, because the nanowire formed of the conductive or semiconductive organic material is formed in the nanofiber formed of the hydrophobic polymer, conductivity or semiconductor properties of the conductive or semiconductive organic material may not be influenced by the ambient environment including moisture and oxygen.

In addition, since the nanofiber composite includes the ionic active material, electrical characteristics of the field effect transistor using the nanofiber composite may be further improved.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A nanofiber composite comprising:
a nanofiber formed of a hydrophobic polymer;
at least one nanowire formed of a conductive or semiconductive organic material that is oriented in the nanofiber in a longitudinal direction of the nanofiber; and
an ionic active material in at least one of the at least one nanowire and the nanofiber,
wherein the at least one nanowire formed of the organic material is a plurality of nanowires.

2. The nanofiber composite of claim 1, wherein the ionic active material is dispersed in the at least one nanowire formed of the organic material and the nanofiber formed of the hydrophobic polymer.

3. The nanofiber composite of claim 1, wherein the nanofiber composite has a core-shell structure comprising a core that comprises the at lease one nanowire formed of the organic material and a shell that surrounds the core and comprises the nanofiber formed of the hydrophobic polymer.

4. The nanofiber composite of claim 1, wherein the hydrophobic polymer comprises at least one selected from the group consisting of polystyrene, styrene copolymers, polyethylene, ethylene copolymers, polybutadiene, butadiene copolymers, polyvinylidene fluoride, and fluoropolymers.

5. The nanofiber composite of claim 1, wherein the conductive or semiconductive organic material comprises at least one selected from the group consisting of poly-3-hexylthiophene, polyaniline, polypyrrole, poly paraphenylene vinylene, polyacetylene, poly[9,9(dioctylfluorenyl-2,7-diyl)-co-(9-hexyl-3,6-carbazole)], poly[9,9(dioctyl fluorenyl-2,7-diyl)-co-(1,4-diphenylenevinylene-2-methoxy-5-{2-ethylhexyloxy}-benzene)], and poly[{2-methoxy-5-(2-ethylhexyl oxy}-1,4-(1-cyanovinylenephenylene))-co-{2,5-bis(N,N'-diphenylamino)-1,4-phenylene}].

6. The nanofiber composite of claim 1, wherein the conductive or semiconductive organic material comprises at least one selected from the group consisting of pentacene, tetracene, antracene, rubrene, parylene, coronen, α-sexithiophene, copper phthalocyanine, merocyanine, perylenetetracarboxyldiimide derivatives, carbon nanotube (CNT), and graphene.

7. The nanofiber composite of claim 1, wherein the ionic active material comprises at least one selected from the group consisting of substituted or unsubstituted imidazolium, pyrazolium, triazolium, thiazolium, oxazolium, pyridazinium, pyrimidinium, pyrazinium, ammonium, phosphonium, guanidinium, euronium, thioeuronium, pyridinium, and pyrrolium, as a cation.

8. The nanofiber composite of claim 1, wherein the ionic active material is an ethylene acrylic acid copolymer, a polyurethane ionomer having a polytrimethylene oxide bond, or an α-olefin copolymer ionomer having ethylene, propylene, 1-butene, 1-pentene, 1-hexene, 1-heptene, 3-methyl-1-butene, or 4-methyl-1-pentene as α-olefin.

9. A field effect transistor comprising:
a gate electrode;
source and drain electrodes electrically insulated from the gate electrode and separated from each other; and
the nanofiber composite according to claim 1 connecting the source and drain electrodes.

10. The nanofiber composite of claim 1, wherein the at least one of the at least one nanowire and the nanofiber is composed of the ionic active material.

11. The nanofiber composite of claim 3, wherein the ionic active material is dispersed in the at least one nanowire formed of the organic material.

12. The field effect transistor of claim 9, wherein the gate electrode is below the source and drain electrodes.

13. The field effect transistor of claim 12, wherein the gate electrode is on the source and drain electrodes.

14. A method of manufacturing a nanofiber composite, the method comprising:
preparing a composition by dissolving a conductive or semiconductive organic material, a hydrophobic polymer, and an ionic active material in a solvent; and
forming a nanofiber composite from the composition, wherein the nanofiber composite comprises a nanofiber formed of the hydrophobic polymer and at least one nanowire formed of the conductive or semiconductive organic material that is oriented in the nanofiber in a longitudinal direction of the nanofiber, wherein the ionic active material is dispersed in the nanofiber and the at least one nanowire,
wherein the nanofiber composite is prepared from the composition by electrospinning, wet spinning, conjugate spinning, melt blown spinning, or flash spinning.

15. The method of claim 14, wherein the conductive or semiconductive organic material comprises at least one selected from the group consisting of poly-3-hexylthiophene, polyaniline, polypyrrole, poly paraphenylene vinylene, polyacetylene, poly[9,9(dioctylfluorenyl-2,7-diyl)-co-(9-hexyl-3,6-carbazole)], poly[9,9(dioctyl fluorenyl-2,7-diyl)-co-(1,4-diphenylenevinylene-2-methoxy-5-{2-ethylhexyloxy}-benzene)], and poly[{2-methoxy-5-(2-ethylhexyl oxy}-1,4-(1-cyanovinylenephenylene))-co-{2,5-bis(N,N'-diphenylamino)-1,4-phenylene}].

16. The method of claim 14, wherein the ionic active material comprises at least one selected from the group consisting of substituted or unsubstituted imidazolium, pyrazolium, triazolium, thiazolium, oxazolium, pyridazinium, pyrimidinium, pyrazinium, ammonium, phosphonium, guanidinium, euronium, thioeuronium, pyridinium, and pyrrolium, as a cation.

17. The method of claim 14, wherein the ionic active material is an ethylene acrylic acid copolymer, a polyurethane ionomer having a polytrimethylene oxide bond, or an α-olefin copolymer ionomer having ethylene, propylene, 1-butene, 1-pentene, 1-hexene, 1-heptene, 3-methyl-1-butene, or 4-methyl-1-pentene as α-olefin.

18. The method of claim 14, wherein the solvent comprises at least one selected from the group consisting of chloroform, chlorobenzene, tetrahydrofuran, toluene, acetone, ethanol, methanol, dimethylformamide, dimethylsulfoxide, benzene, dioxane, cyclohexane, acetic acid, and water.

19. The method of claim 14, wherein the at least one of the at least one nanowire and the nanofiber is formed of the ionic active material.

20. The method of claim 18, wherein the solvent is a mixture of two solvents.

* * * * *